United States Patent
Kearney et al.

(10) Patent No.: US 9,160,356 B1
(45) Date of Patent: Oct. 13, 2015

(54) ANALOG TO DIGITAL CONVERTOR AND A METHOD OF CALIBRATING SAME

(71) Applicant: Analog Devices Global, Hamilton (BM)

(72) Inventors: Niall Kevin Kearney, Cork (IE); Keith O'Donoghue, Carrigaline (IE); Hongxing Li, Andover, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/334,545

(22) Filed: Jul. 17, 2014

(51) Int. Cl.
*H03M 1/10* (2006.01)

(52) U.S. Cl.
CPC .................................. *H03M 1/1009* (2013.01)

(58) Field of Classification Search
CPC ........ H03M 1/06; H03M 1/1009; H03M 3/30
USPC .......................................... 341/120, 143, 155
See application file for complete search history.

(56) References Cited

U.S. PATENT DOCUMENTS

| | | | |
|---|---|---|---|
| 7,439,891 B2 | 10/2008 | Kozak et al. | |
| 7,466,256 B2 * | 12/2008 | Brueske et al. | 341/143 |
| 7,928,878 B1 * | 4/2011 | Coban et al. | 341/143 |
| 7,983,640 B2 * | 7/2011 | Doerrer | 455/230 |
| 8,515,372 B2 * | 8/2013 | Kaczman et al. | 455/226.4 |
| 8,519,878 B2 | 8/2013 | Jensen et al. | |
| 8,760,330 B2 * | 6/2014 | Ritter et al. | 341/143 |

OTHER PUBLICATIONS

Temes, G. and Schreier, R., Understanding Delta-Sigma Data Converters, John Wiley & Sons, 2005, pp. 107-109.
Temes, G. and Schreier, R., Understanding Delta-Sigma Data Converters, John Wiley & Sons, 2005, pp. 64-65.
Crols, J. and Steyaert, M. S., "Low-IF Topologies for High-Performance Analog Front Ends of Fully Integrated Receivers," IEEE Transactions on Circuits and Systems II: Analog and Digital Signal Processing, vol. 45, No. 3, Mar. 1998, pp. 269-282.
Cheng, K.-W., et al., "A Current Reuse Quadrature GPS Receiver in 0.13um CMOS," IEEE Journal of Solid-State Circuits, vol. 45, No. 3, Mar. 2010, pp. 510-523.
Breems, L., et al., "A 1.8-mW CMOS Sigma-Delta modulator with integrated mixer for A/D conversion of IF signals," IEEE Journal of Solid-State Circuits, vol. 35, No. 4, Apr. 2000, pp. 468-475.
Silva, P., et al., "An IF-to-Baseband Sigma-Delta Modulator for AM/FM/IBOC Radio Receivers With a 118 dB Dynamic Range," IEEE Journal of Solid-State Circuits, vol. 42, No. 5, May 2007, pp. 1076-1089.
Schreier, R. and Zhang, B., "Delta-sigma modulators employing continuous-time circuitry," IEEE Transactions on Circuits and Systems I: Fundamental Theory and Applications, vol. 43, No. 4, Apr. 1996, pp. 324-332.
Yan, S. and Sanchez-Sinencio, E., "A continuous-time sigma-delta modulator with 88-dB dynamic range and 1.1-MHz signal bandwidth," IEEE Journal of Solid-State Circuits, vol. 39, No. 1, Jan. 2004, pp. 75-86.
Kim, S.-B., et al., "A 2.7 mW, 90.3 dB DR Continuous-Time Quadrature Bandpass Sigma-Delta Modulator for GSM/EDGE Low-IF Receiver in 0.25 um CMOS," IEEE Journal of Solid-State Circuits, vol. 44, No. 3, Mar. 2009, pp. 891-900.

* cited by examiner

*Primary Examiner* — Khai M Nguyen
(74) *Attorney, Agent, or Firm* — Knobbe Martens Olson & Bear

(57) ABSTRACT

An analog to digital convertor (ADC) comprises an integrator having an input selectively connected to an intermediate frequency (IF) signal input and an output connected to a summer. The summer has an output connected to an input of a quantizer, the quantizer output being operatively connected to a signal strength indicator. The integrator includes a programmable gain feedback component. The summer has a synthesized calibration signal input, the value of the programmable gain feedback component being configured to vary when a synthesized calibration signal at the intermediate frequency is applied to the summer. The signal strength indicator is configured to detect a value of the programmable gain feedback component when the signal strength is minimized and to calibrate the ADC accordingly.

22 Claims, 6 Drawing Sheets

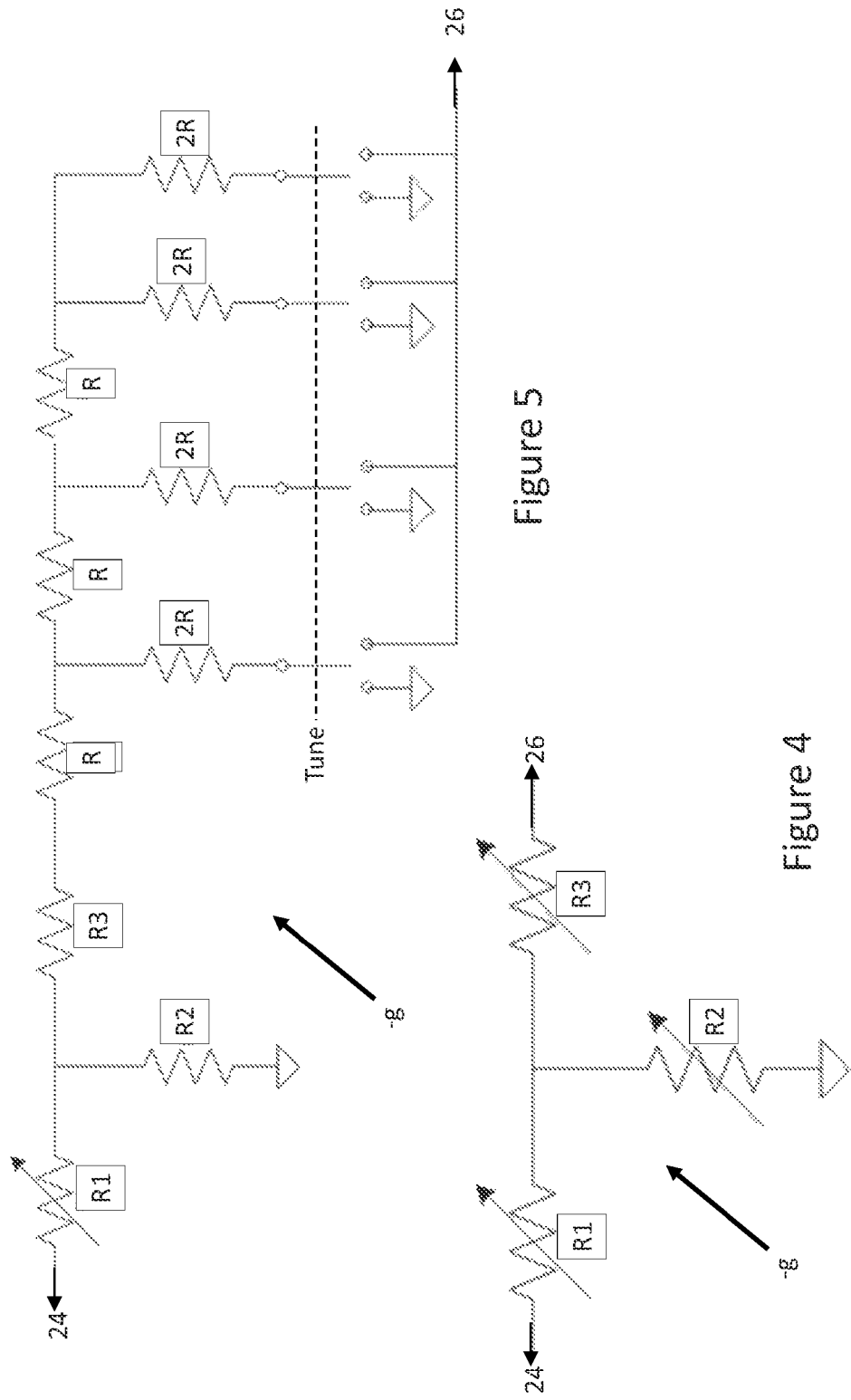

ANALOG TO DIGITAL CONVERTOR AND A METHOD OF CALIBRATING SAME

FIELD

The present disclosure relates to an analog to digital converter (ADC) and a method of calibrating the same.

BACKGROUND

Low power radio frequency (RF) transceivers are becoming increasingly important for a variety of wireless communication networks including wireless metering, home automation, wireless alarms and sensor networks.

One feature of such systems is a low bandwidth requirement for the various wireless sensors and transducers nodes on the network. For example, RF receive channels operating in these systems can desire narrowband operation ranging anywhere from, for example, 5 kHz to 50 kHz while maintaining high performance sensitivity, adjacent channel rejection and low active power specifications.

A common type of receiver employed in these systems comprises an intermediate frequency (IF) receiver and these typically include an analog to digital converter (ADC) within the receive path.

The term "noise transfer function" (NTF) can be used for the transfer function of the quantization noise of the ADC. If the NTF has a notch in the transfer function, then the quantization noise of the ADC will experience attenuation at the ADC output in the region around the notch frequency, with maximum attenuation occurring at the notch frequency itself.

It is known that placing the NTF notch at IF increases Signal to Quantization Noise Ratio (SQNR) without the need to increase for example, ADC oversampling ratio, sampling clock frequency or modulator order. Accurately locating the NTF notch at IF, in particular in Continuous-Time Sigma-Delta (CT-$\Delta\Sigma$) ADCs, is subject to manufacturing and temperature variations, and hence a method to autonomously calibrate is desired.

SUMMARY

An embodiment of the present invention provides an analog to digital converter (ADC) comprising an integrator having an input selectively connected to an intermediate frequency (IF) signal input and an output connected to a summer. The summer has an output connected to an input of a quantizer, the quantizer output being operatively connected to a signal strength indicator. The integrator includes a programmable gain feedback component. The summer has a synthesized calibration signal input, the value of the programmable gain feedback component being configured to vary when a synthesized calibration signal at the intermediate frequency is applied to the summer. The signal strength indicator is configured to detect a value of the programmable gain feedback component when the signal strength is minimized and to calibrate the ADC accordingly.

The notch in the ADC NTF can be used to filter in-band quantization noise to improve ADC SQNR and so maximize ADC performance in an IF receiver channel. Placing the NTF notch at $f_{IF}$ can yield significant improvements in ADC performance in a narrow frequency band around $f_{IF}$.

In some embodiments, the ADC comprises a continuous time-sigma delta (CT-$\Delta\Sigma$) ADC.

Through calibration, the ADC can accommodate variations in the notch frequency due to circuit non-idealities, mismatch and PVT variations which could otherwise significantly degrade ADC performance.

The calibration can position the NTF notch as close as possible to $f_{IF}$. Using a calibration tone injected at the input to the quantizer, a search algorithm can position the notch at $f_{IF}$ on ADC startup, within the resolution provided for in the NTF coefficient adjustment.

In a further aspect, there is provided a method of calibrating an analog to digital converter according to an embodiment of the present invention.

In a still further aspect, there is provided an intermediate frequency (IF) receiver including an analog to digital converter according to an embodiment of the present invention.

Preferably, the receiver is a narrow-band (5 kHz to 50 kHz), low-IF (80 kHz to 200 kHz) receiver.

In still further aspects, there is provided a transceiver incorporating an intermediate frequency receiver according to an embodiment of the invention.

BRIEF DESCRIPTION OF THE DRAWINGS

Embodiments of the invention will now be described, by way of example, with reference to the accompanying drawings, in which:

FIGS. 4 and 5 illustrate circuits allowing the feedback path parameter of FIG. 6 to be adjusted;

DESCRIPTION OF CERTAIN EMBODIMENTS

Figure 1:
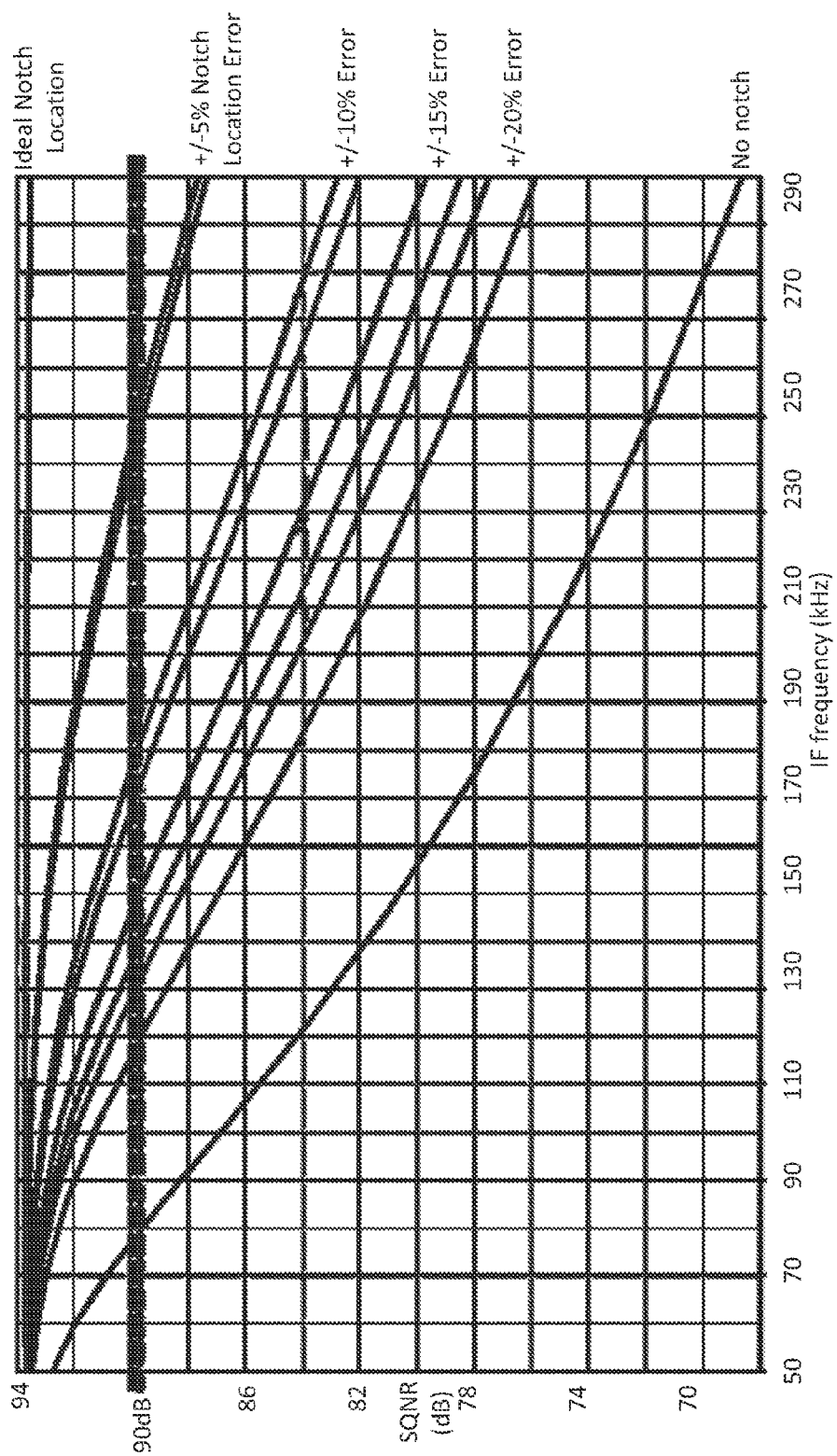
FIG. 1 shows output SQNR vs IF frequency for increasing notch location error from ideal.

Any deviation in the frequency of the notch in the ADC NTF from ideal can cause a significant loss in ADC output SQNR and therefore degrade overall receiver performance. FIG. 1 shows the impact on ADC SQNR in a 5 kHz bandwidth with an error in NTF notch location from ±5 to ±20% relative to the ideal notch location at $f_{IF}$. It is clear that even for a relatively small ±5% deviation in the notch frequency a 3 dB reduction in ADC SQNR is experienced with $f_{IF}$=200 kHz. For a ±10% deviation in the notch frequency a loss of almost 4 dB in output SQNR is measured for all $f_{IF}$ >170 kHz.

There are many factors which can impact the final position of the notch in the NTF and many of these are not necessarily well controlled in a final circuit implementation. As will be appreciated, guaranteeing the position of the notch within, for example, 5% given such circuit non-idealities, mismatch and process, voltage and temperature (PVT) variations is extremely difficult.

It is an object of this disclosure to provide an ADC in which the notch can be positioned within a given range of the intermediate frequency to improve ADC performance in spite of such non-idealities, mismatches and variations.

Figure 2:
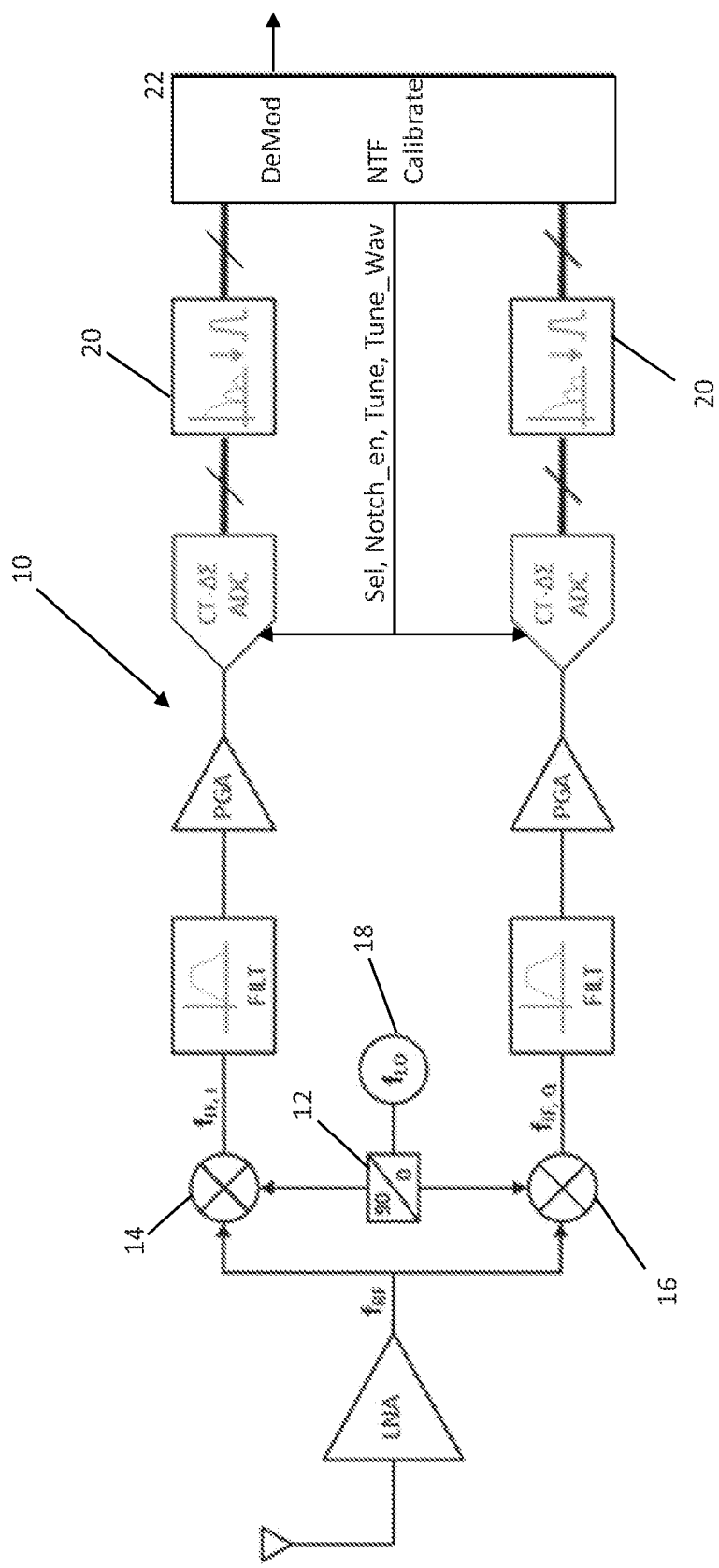
FIG. 2 shows an IF I/Q Receiver according to an embodiment of the present invention.

Referring now to FIG. 2, there is shown a block diagram of an intermediate-frequency (IF) receiver 10 with in-phase (I) and quadrature-phase (Q) signal paths according to an embodiment of the present invention.

The receiver 10 comprises a low noise amplifier (LNA) followed by an I/Q mixer 12, 14, 16 which downconverts the incoming RF signal using a local oscillator 18 into an I and Q signal path. A real bandpass analog filter (FILT) is used to select the IF band and is followed by a programmable gain amplifier (PGA) and an continuous time-delta sigma (CT-ΔΣ) analog-to-digital converter (ADC) which digitizes the IF signal before further digital filtering, downsampling and conversion to baseband within block 20 and then demodulation within a controller 22.

Figure 3:
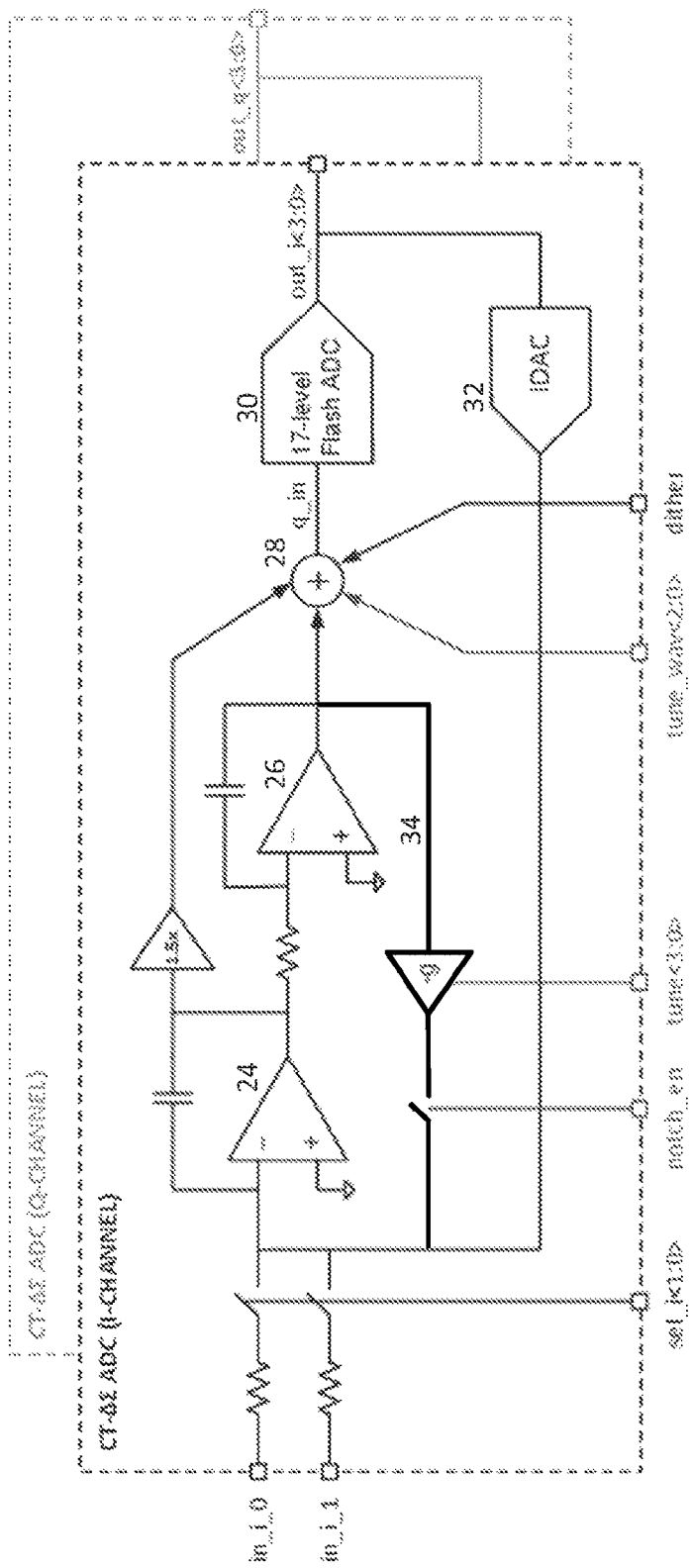
FIG. 3 shows in detail a CT-$\Delta\Sigma$ ADC with notch filter for use within the receiver of FIG. 2.

FIG. 3 shows in more detail an example $2^{nd}$-order low-pass CT-ΔΣ ADC of the IF receiver 10 of FIG. 2. The $2^{nd}$-order structure includes two integrators 24, 26, an active summer 28, an ADC quantizer 30 and a Current Digital to Analog Converter (IDAC) 32 providing a feedback path. The term "noise transfer function" (NTF) can refer to the transfer function of the ADC quantizer 30 from quantizer input (q_in) to the ADC output (out_i). If the NTF has a notch in the transfer function, then an injected signal at q_in can consequently experience attenuation at the ADC output in the region around the notch frequency with maximum attenuation occurring at the notch frequency itself. In the $2^{nd}$-order structure shown in FIG. 3 the NTF zeros are shifted from their default position at DC by inserting an extra feedback path 34 with a programmable gain feedback component (gain) '−g' from the output of the second integrator 26 to the input of the first integrator 24. Together, the first integrator 24, the second integrator 26, and the feedback path 34 can be referred to as an integrator.

In the illustrated embodiment, the position of the notch in the NTF of each ADC quantizer 30 is adjusted using a programmable value of a feedback parameter that sets the gain −g to shift the zero in the NTF from 0 Hz (direct current) to a desired notch frequency.

Each of the I-channel ADC and Q-channel ADC have a number of additional inputs connecting the respective ADCs to the receiver controller 22:

Sel_i disconnects the ADC inputs in_i_0 and in_i_1 from the IF front end of the receiver, so decoupling the ADC from any RF signal input during calibration. Similarly Sel_q (not shown) is provided for the Q channel ADC. One particular advantage of this approach is that it allows for calibration of the front end PLL portion of the receiver to be carried out in parallel to the notch calibration of the ADCs. In the present embodiment, each of the I-channel ADC and the Q-channel ADC are calibrated separately and sequentially but of course if calibration speed were a priority over processing resources, this could be done in parallel.

In the embodiment, Tune_wav<2:0> is an 8-level (3 bit) synthesized quasi-sinusoidal calibration signal injected via the active summer 28 at the input to the ADC quantizer 30. By injecting this calibration signal at the input to the ADC quantizer 30, it can experience approximately the same transfer function as the ADC quantization noise—i.e. the NTF. The frequency chosen is the IF frequency of the receiver and this is readily generated by the controller 22 as a fraction of the sampling rate of the $f_s$ of the ADC. In variations of the embodiment, other forms of calibration signal than quasi-sinusoidal can be employed.

In the illustrated embodiment, tune<3:0> is a 4 bit bus allowing the position of the notch to be adjusted by varying the value of the gain −g. In other embodiments, tuning data can include any suitable number of bits. FIG. 4 shows one passive embodiment for realizing the gain −g, and how it can be adjusted by adjusting a value of resistance in the feedback path 34 between the output of the second integrator 26 and the input of the first integrator 24, in this case using the bus value of tune<3:0> to electrically vary the values of resistors R1, R2 and R3. FIG. 5 illustrates a digital solution in which tune<3:0> is used to control 4 switches in a resistor network connecting integrators 24 and 26. The resistance values or resistors R and/or R1, R2 and R3 can be chosen so that across the range of tune<3:0>, the ADC will provide a minimum output when the calibration tone tune_wav is applied to the summer 28. Other embodiments exist for realizing the gain term −g, including digitally controlled active circuitry.

In the illustrated embodiment, the gain −g lies in a feedback path 34 between the output of the first integrator 24 and the input of the second integrator 26. In other embodiments, the programmable gain feedback component can extend between the input and output of just one of the integrators 24 or 26; or separate programmable gain feedback components could extend between the input and output of respective integrators 24 and 26. In the illustrated embodiment, notch_en is provided to allow notch positioning at IF to be enabled or disabled—thereby allowing the SQNR of the ADC(s) to be optimized while digitizing a downconverted signal at IF during a receive operation when notch_en is enabled, or allowing the zero to be placed at 0 Hz for optimized SQNR when digitizing direct current (DC) signals in other use modes within the transceiver when notch_en is disabled.

Figure 6:
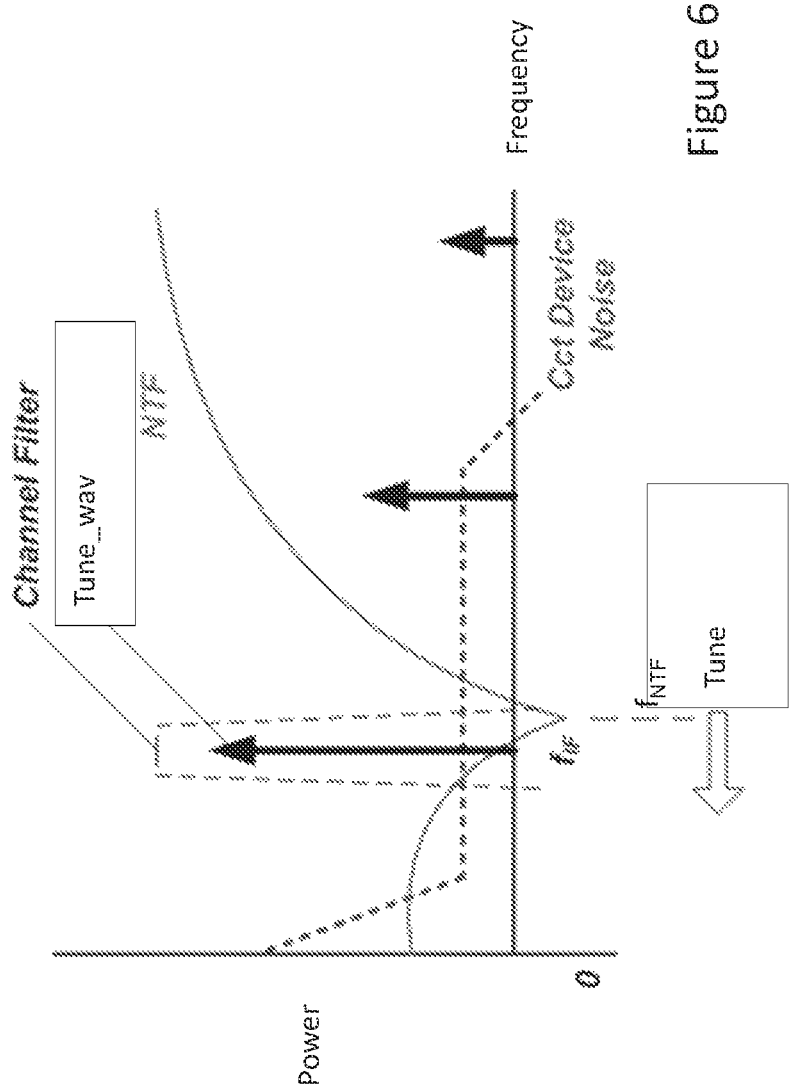
FIG. 6 shows the effect on quantizer NTF of varying the feedback path parameter in the receiver of FIG. 2.

FIG. 6 shows the ADC output power when a calibration tone, Tune_wav, is injected. The quantization noise power, shaped by the NTF, is also indicated, along with inherent electronic circuit noise of the ADC. The position of the NTF notch is adjusted in accordance with varying the value of tune<3:0>. The plot shows a region, around the frequency $f_{NTF}$, where the power of the injected calibration tone is significantly attenuated as the position of the notch approaches the calibration tone frequency $f_{IF}$.

Finding the particular value from 0 . . . 15 of tune<3:0> which produces this minimum can be performed using any one of a number of algorithms, such as an exhaustive, linear, binary or successive approximation search algorithm. Linear, binary, or success approximation search algorithms can reduce calibration time. The controller 22 can be configured to perform one or more of these search algorithms. The search can place the notch within a desired range of $f_{IF}$ depending on the granularity of the notch adjust circuitry, shown for example in FIGS. 4 and 5. For example, for a typical IF receiver of the type shown in FIGS. 2 and 3, using a 4 bit tune register, the notch could be placed within approximately 2% of $f_{IF}$ in spite of circuit non-idealities, mismatch and PVT variations outlined above.

There are a number of techniques for assessing the ADC output while the gain −g is adjusted.

In one implementation, the controller 22 performs a Discrete Fourier Transform (DFT) of the output signal for the ADC being calibrated. The controller 22 can measure the DFT bin at IF frequency. The tune<3:0> value (code) which provides the minimal IF DFT power (signal strength) can then be chosen as that best positioning the notch.

Another implementation utilizes a channel power estimation function typically provided in transceivers—the Received Signal Strength Indication (RSSI). The channel power estimator function can be implemented by the controller 22. This is typically performed by computing the sum of the squares of the I-channel and Q-channel signals at the output of the channel select filter 20. Again, the tune<3:0> value (code) which minimizes the measured power during the application of Tune_wav can be selected.

Figure 7:
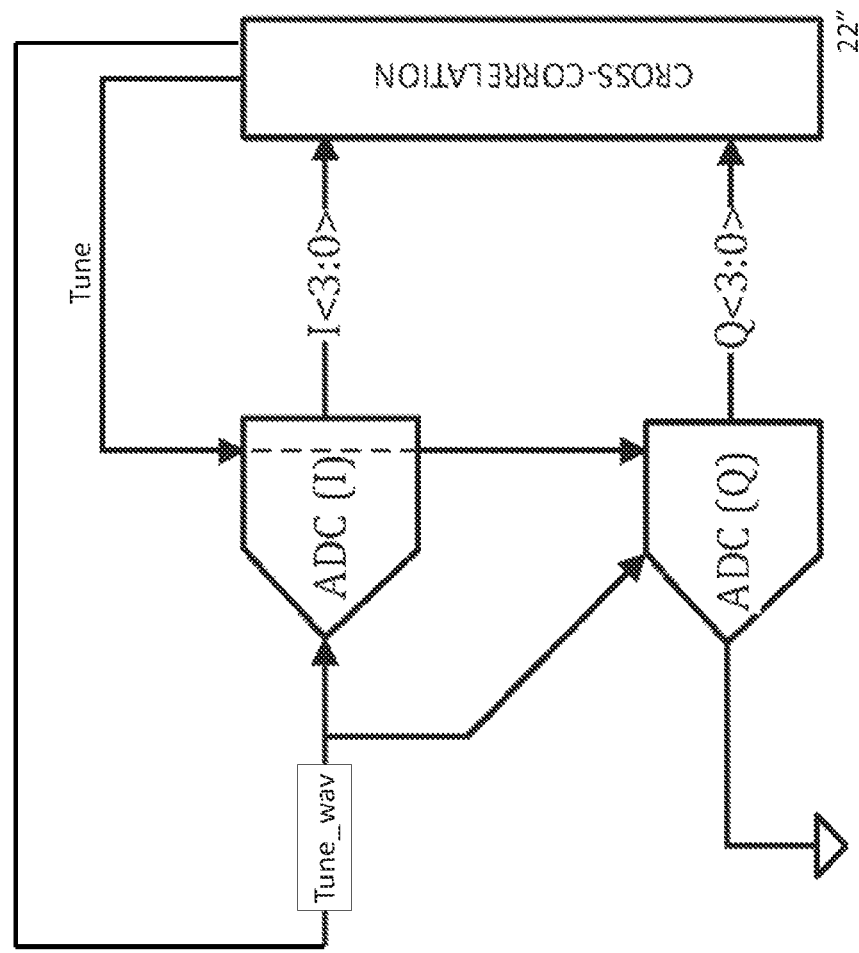
FIG. 7 illustrates a cross-correlation based calibration method for use within a receiver of the type shown in FIG. 2.

FIG. 7 shows a further cross-correlation based technique for determining when an optimal value of Tune is found. Here, a controller 22" can be implemented by a processor that generates the input tone Tune_wav as described above and injects this at tone the input (in_i_0, in_i_1) to the I-channel ADC as well as at the input to the quantizer in the Q-channel ADC (via an active summer as in FIG. 3). Switches (not shown) equivalent to the switches controlled by sel_i<1:0> in FIG. 3 can be used to decouple the ADCs from the receiver front end and to set the I-channel input to Tune_wav and the Q-channel ADC input to common-mode zero. Tune_wav can appear as expected in the digital domain at the output of the I-channel and be attenuated by the NTF at the output of the Q-channel. As the notch location is tuned by varying the value of tune<3:0> as in the embodiment illustrated in FIG. 3, the amount of signal content at the Q-channel output can vary, with maximum attenuation of the signal occurring when the notch frequency most closely matches $f_{IF}$. This attenuation of the cross-correlation can be detected by monitoring the accumulated product of the I and Q ADC outputs. The process can be reversed in order to calibrate the I-channel ADC if it is thought that this might benefit from different calibration than the Q-channel.

Once calibration is complete, the controller 22 of FIG. 3 or the controller 22" of FIG. 7 can write the selected tuning value(s) to a backup battery powered memory (not shown). Thus, ADC tuning can optionally be performed once, with the tuning value(s) being subsequently restored from backup battery powered memory during power up of the receiver.

On the other hand, if the receiver is to function across a large range of operating temperatures, it could be desirable to schedule a re-tune when ambient temperature is determined to have shifted by more than a threshold amount from the temperature when tuning was performed previously. In this case, the stored value for tune<3:0> can be used as a starting point for a fine search to take into account temperature variation.

The systems, apparatus, and methods for calibration are described above with reference to certain embodiments. A skilled artisan will, however, appreciate that the principles and advantages of the embodiments can be used for any other systems, apparatus, or methods with a need for calibration to avoid quantization noise.

Such systems, apparatus, and/or methods can be implemented in various electronic devices. Examples of the electronic devices can include, but are not limited to, consumer electronic products, parts of the consumer electronic products, electronic test equipment, wireless communications infrastructure, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Description of Preferred Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

The invention claimed is:

1. An analog to digital convertor (ADC) comprising an integrator a summer, and a quantizer, the integrator having an input selectively connected to an intermediate frequency (IF) signal input and an output connected to the summer, the summer having an output connected to an input of the quantizer, the quantizer output being operatively connected to a signal strength indicator, said integrator including a programmable gain feedback component, said summer having a synthesized calibration signal input, a value of the programmable gain feedback component being configured to vary when a synthesized calibration signal at said intermediate frequency is applied to said summer, said signal strength indicator being configured to detect the value of said programmable gain feedback component when a signal strength is minimized and to calibrate said ADC accordingly.

2. An ADC according to claim 1 wherein said signal strength indicator comprises a discrete Fourier transform (DFT) component configured to output a DFT bin value at said IF.

3. An ADC according to claim 1 wherein said signal strength indicator comprises a channel power estimator.

4. An ADC according to claim 1 wherein said programmable gain feedback component comprises a network of resistors connected between said integrator output and said integrator input.

5. An ADC according to claim 4 wherein said resistors are selectively switched according to a programmable gain value.

6. An ADC according to claim 4 wherein said resistors are varistors whose value is set according to a programmable gain value.

7. An ADC according to claim 1 wherein said programmable gain feedback component includes at least one digitally controlled active component connected between said integrator output and said integrator input.

8. An ADC according to claim 1 wherein said synthesized calibration signal comprises a multi-level discrete valued signal having more than two signal levels.

9. An ADC according to claim 1 wherein said synthesized calibration signal comprises a quasi-sinusoidal signal.

10. An ADC according to claim 1 wherein said ADC comprises a continuous time-sigma delta (CT-ΔΣ) ADC further comprising a current DAC (IDAC) connected between said quantizer output and said integrator input.

11. An ADC according to claim 1 wherein said integrator comprises a $2^{nd}$-order integrator comprising first and second serially connected integrators, an input of said first integrator being connected to an input of said summer and wherein said programmable feedback path connects an output of the second integrator to an input of the first integrator.

12. An ADC according to claim 1 wherein said programmable feedback path is configured to be selectively disconnected.

13. A method for calibrating an ADC according to claim 1, the method comprising:
 disconnecting said intermediate frequency signal from said integrator input;
 injecting said synthesized calibration signal into said summer;
 varying said value of said programmable gain feedback component;
 measuring said quantizer output as said value of said programmable gain feedback component is varied; and
 identifying said value of the programmable gain feedback component when said quantizer output is minimized.

14. An intermediate frequency receiver comprising an antenna connected to a low noise amplifier, said low noise amplifier having an output connected to a mixer configured to mix a received radio frequency (RF) signal with a local oscillator (LO) signal to provide said intermediate frequency (IF) signal at a lower frequency than said received RF signal and an ADC according to claim 1 configured to convert said IF signal to a digital signal.

15. A receiver comprising a quadrature LO and respective IQ IF channels according to claim 14.

16. A transceiver comprising an IF receiver according to claim 14 and a transmitter path operatively connected to said antenna.

17. An apparatus comprising:
 an analog-to-digital converter (ADC) comprising:
  an integrator having a feedback path from an output of the integrator to an input of the integrator, wherein a gain of the integrator is programmable based on a tuning signal provided to the feedback path; and
  a quantizer in communication with the integrator, the quantizer configured to quantize an analog input and provide a digital output; and
 a controller in communication with the ADC, the controller configured to:
  provide a calibration signal to the ADC;
  while providing the calibration signal to the ADC, adjust the tuning signal provided to the feedback path and determine a selected value of the tuning signal provided to the feedback path based on an output of the ADC; and
  provide the selected value of the tuning signal to the ADC to set a desired location of a notch in a noise transfer function of the ADC.

18. The apparatus of claim 17, wherein the integrator is configured to adjust the gain by adjusting an impedance in the feedback path based on the tuning signal.

19. The apparatus of claim 17, wherein the ADC further comprises a summer configured to receive an output of the integrator and the calibration signal and to provide a summer output to the quantizer.

20. The apparatus of claim 17, wherein the apparatus comprises an intermediate frequency receiver, the intermediate frequency receiver includes the ADC, and the integrator is configured to integrate an intermediate frequency signal.

21. The apparatus of claim 20, wherein the ADC is configured selectively decouple the intermediate frequency signal from the integrator, and wherein the controller is configured to determine the selected value of the tuning signal while the intermediate frequency signal is decoupled from the integrator.

22. The apparatus of claim 17, wherein the controller is configured to determine the selected value of the tuning signal based on a minimum power level of the output of the ADC while the calibration signal is provided to the ADC.

* * * * *

UNITED STATES PATENT AND TRADEMARK OFFICE
CERTIFICATE OF CORRECTION

| | | |
|---|---|---|
| PATENT NO. | : 9,160,356 B1 | Page 1 of 1 |
| APPLICATION NO. | : 14/334545 | |
| DATED | : October 13, 2015 | |
| INVENTOR(S) | : Kearney et al. | |

It is certified that error appears in the above-identified patent and that said Letters Patent is hereby corrected as shown below:

In the claims

Column 6 at line 35, Claim 1, change "integrator" to --integrator,--.

Signed and Sealed this
Twenty-first Day of June, 2016

Michelle K. Lee
*Director of the United States Patent and Trademark Office*